United States Patent
Kim

(10) Patent No.: US 12,288,823 B2
(45) Date of Patent: Apr. 29, 2025

(54) THIN FILM TRANSISTOR ARRAY SUBSTRATE, ORGANIC LIGHT-EMITTING DISPLAY APPARATUS, AND METHOD OF MANUFACTURING THE THIN FILM TRANSISTOR ARRAY SUBSTRATE

(71) Applicant: Samsung Display Co., Ltd., Yongin-si (KR)

(72) Inventor: Jung-Bae Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/501,614

(22) Filed: Nov. 3, 2023

(65) Prior Publication Data

US 2024/0063308 A1 Feb. 22, 2024

Related U.S. Application Data

(60) Continuation of application No. 17/360,582, filed on Jun. 28, 2021, now Pat. No. 11,843,060, which is a
(Continued)

(30) Foreign Application Priority Data

Oct. 17, 2013 (KR) .................. 10-2013-0124145

(51) Int. Cl.
*H01L 29/786* (2006.01)
*H01L 27/12* (2006.01)
(Continued)

(52) U.S. Cl.
CPC .... *H01L 29/78696* (2013.01); *H01L 27/1225* (2013.01); *H01L 27/1251* (2013.01); *H01L 29/66969* (2013.01); *H01L 29/78618* (2013.01); *H01L 29/7869* (2013.01); *H01L 21/02565* (2013.01)

(58) Field of Classification Search
None
See application file for complete search history.

(56) References Cited

U.S. PATENT DOCUMENTS 7,399,662 B2   7/2008   Yanai et al.
8,525,181 B2   9/2013   Kim et al.
(Continued)

FOREIGN PATENT DOCUMENTS

JP   2003-45892   2/2003
JP   2007-73559   3/2007
(Continued)

*Primary Examiner* — Cory W Eskridge
(74) *Attorney, Agent, or Firm* — KILE PARK REED & HOUTTEMAN PLLC

(57) ABSTRACT

Provided is a thin film transistor including an active layer including a first silicon active layer, a second silicon active layer, and an oxide active layer in a space between the first silicon active layer and the second silicon active layer, a gate electrode on the active layer with a gate insulating layer disposed therebetween, and a source electrode and a drain electrode with an interlayer insulating layer disposed between the gate electrode and the source and drain electrodes, the source and drain electrodes being in contact with the first silicon active layer and the second silicon active layer, respectively.

17 Claims, 8 Drawing Sheets

Related U.S. Application Data continuation of application No. 16/553,240, filed on Aug. 28, 2019, now Pat. No. 11,049,978, which is a continuation of application No. 16/042,268, filed on Jul. 23, 2018, now Pat. No. 10,403,764, which is a continuation of application No. 15/622,680, filed on Jun. 14, 2017, now Pat. No. 10,032,933, which is a division of application No. 14/516,889, filed on Oct. 17, 2014, now Pat. No. 9,698,279.

(51) Int. Cl.
*H01L 29/66* (2006.01)
*H01L 21/02* (2006.01)

(56) References Cited

U.S. PATENT DOCUMENTS

| | | | |
|---|---|---|---|
| 9,406,705 | B2 | 8/2016 | Kwon et al. |
| 10,403,764 | B2 | 9/2019 | Kim |
| 11,049,978 | B2 | 6/2021 | Kim |
| 11,843,060 | B2 * | 12/2023 | Kim .................. H01L 29/7869 |
| 2007/0152217 | A1 | 7/2007 | Lai et al. |
| 2007/0278490 | A1 | 12/2007 | Hirao et al. |
| 2009/0283763 | A1 | 11/2009 | Park et al. |
| 2010/0176392 | A1 | 7/2010 | Kang et al. |
| 2010/0176395 | A1 | 7/2010 | Choi et al. |
| 2010/0182223 | A1 * | 7/2010 | Choi .................. G09G 3/3233 |
| | | | 345/76 |
| 2011/0049523 | A1 * | 3/2011 | Choi .................. H01L 27/1225 |
| | | | 438/34 |
| 2011/0240998 | A1 | 10/2011 | Morosawa et al. |
| 2013/0240886 | A1 | 9/2013 | Yeh et al. |

FOREIGN PATENT DOCUMENTS

| | | |
|---|---|---|
| KR | 10-2010-0082935 | 7/2010 |
| KR | 10-2010-0083322 | 7/2010 |
| KR | 10-2010-0086256 | 7/2010 |
| KR | 10-2011-0021259 | 3/2011 |
| KR | 10-2013-0015703 | 2/2013 |

* cited by examiner

THIN FILM TRANSISTOR ARRAY SUBSTRATE, ORGANIC LIGHT-EMITTING DISPLAY APPARATUS, AND METHOD OF MANUFACTURING THE THIN FILM TRANSISTOR ARRAY SUBSTRATE

CROSS-REFERENCE TO RELATED APPLICATION(S)

This is a continuation application of U.S. patent application Ser. No. 17/360,582 filed Jun. 28, 2021, which issued as U.S. Pat. No. 11,843,060 on Dec. 12, 2023, the disclosure of which is incorporated herein by reference in its entirety. U.S. patent application Ser. No. 17/360,582 is a continuation application of U.S. patent application Ser. No. 16/553,240 filed Aug. 28, 2019, now U.S. Pat. No. 11,049,978, issued Jun. 29, 2021, the disclosure of which is incorporated herein by reference in its entirety. U.S. patent application Ser. No. 16/553,240 is a continuation application of U.S. patent application Ser. No. 16/042,268 filed Jul. 23, 2018, now U.S. Pat. No. 10,403,764, issued Sep. 3, 2019, the disclosure of which is incorporated herein by reference in its entirety. U.S. patent application Ser. No. 16/042,268 is a continuation application of U.S. patent application Ser. No. 15/622,680 filed Jun. 14, 2017, now U.S. Pat. No. 10,032,933, issued Jul. 24, 2018, the disclosure of which is incorporated herein by reference in its entirety. U.S. patent application Ser. No. 15/622,680 is a divisional application of U.S. patent application Ser. No. 14/516,889 filed Oct. 17, 2014, now U.S. Pat. No. 9,698,279, issued Jul. 4, 2017, the disclosure of which is incorporated herein by reference in its entirety. U.S. patent application Ser. No. 14/516,889 claims priority benefit of Korean Patent Application No. 10-2013-0124145 under 35 U.S.C. § 119, filed Oct. 17, 2013, the entire contents of which are incorporated herein by reference.

BACKGROUND

1. Field

One or more embodiments relate to a thin film transistor array substrate, an organic light-emitting display apparatus, and a method of manufacturing the thin film transistor array substrate.

2. Description of the Related Art

Thin film transistor array substrates, which include thin film transistors, capacitors, and wirings connecting the thin film transistors and the capacitors, are being widely used in flat panel display apparatuses, such as liquid crystal display apparatuses and organic light-emitting display apparatuses.

In an organic light-emitting display apparatus using a thin film transistor array substrate, each pixel is defined by arranging pluralities of gate lines and data wirings in the form of a matrix. Each pixel includes thin film transistors, a capacitor, and an organic light-emitting device connected thereto. The organic light-emitting device may emit light by receiving appropriate driving signals from the thin film transistors and the capacitor, and thus may generate a desired image.

SUMMARY

Embodiments may be realized by providing a thin film transistor, including an active layer on a substrate, the active layer including a first silicon active layer, a second silicon active layer, and an oxide active layer in a space between the first silicon active layer and the second silicon active layer; a gate electrode on the active layer with a gate insulating layer disposed therebetween; and a source electrode and a drain electrode with an interlayer insulating layer disposed between the gate electrode and the source and drain electrodes, the source and drain electrodes being in contact with the first silicon active layer and the second silicon active layer, respectively.

Regions of the first silicon active layer and the second silicon active layer that do not overlap the gate electrode may be doped with $N^+$ or $P^+$ ion impurities.

The source electrode and the drain electrode may not overlap the gate electrode.

The first silicon active layer and the second silicon active layer may include amorphous silicon or polysilicon.

The oxide active layer may include one or more oxides selected from the group of gallium indium zinc oxide (G-I-Z-O), an oxide of zinc (Zn), indium (In), gallium (Ga), tin (Sn), cadmium (Cd), germanium (Ge), or hafnium (Hf), and a combination thereof.

Embodiments may be realized by providing an organic light-emitting display apparatus, including a first transistor which includes a first gate electrode, a first active layer including a silicon active layer and an oxide active layer, and a first source electrode and a first drain electrode, the silicon active layer of the first transistor including a first silicon active layer and a second silicon active layer, and the oxide active layer being between the first silicon active layer and the second silicon active layer; a second transistor which includes a second gate electrode that is formed of a same material and on a same layer as the first gate electrode, a second active layer that is formed of a same material and on a same layer as the silicon active layer, and a second source electrode and a second drain electrode that are formed of a same material and on a same layer as the first source electrode and the first drain electrode; and a light-emitting device including a pixel electrode, an intermediate layer, and a counter electrode.

The first transistor may be a switching transistor of the organic light-emitting display apparatus.

The second transistor may be a driving transistor of the organic light-emitting display apparatus.

The pixel electrode may be connected to the second source electrode or the second drain electrode of the second transistor.

Regions of the first silicon active layer and the second silicon active layer that do not overlap the first gate electrode may be doped with $N^+$ or $P^+$ ion impurities.

The first source electrode and the first drain electrode may not overlap the first gate electrode.

The first silicon active layer and the second silicon active layer may include amorphous silicon or polysilicon.

The oxide active layer may include one or more oxides selected from the group of gallium indium zinc oxide (G-I-Z-O), an oxide of zinc (Zn), indium (In), gallium (Ga), tin (Sn), cadmium (Cd), germanium (Ge), or hafnium (Hf), and a combination thereof.

Embodiments may be realized by providing a method of manufacturing a thin film transistor including forming a silicon layer on a substrate and then patterning the silicon layer to form a first silicon active layer and a second silicon active layer with a space therebetween; forming an oxide semiconductor layer and then patterning the oxide semiconductor layer to form an oxide active layer in the space between the first silicon active layer and the second silicon active layer; forming a gate insulating layer and forming a gate electrode on the gate insulating layer; doping the first silicon active layer and the second silicon active layer with ion impurities using the gate electrode as a mask; and forming an interlayer insulating layer, and forming a source electrode and a drain electrode respectively in contact with the first silicon active layer and the second silicon active layer through contact holes in the gate insulating layer and the interlayer insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
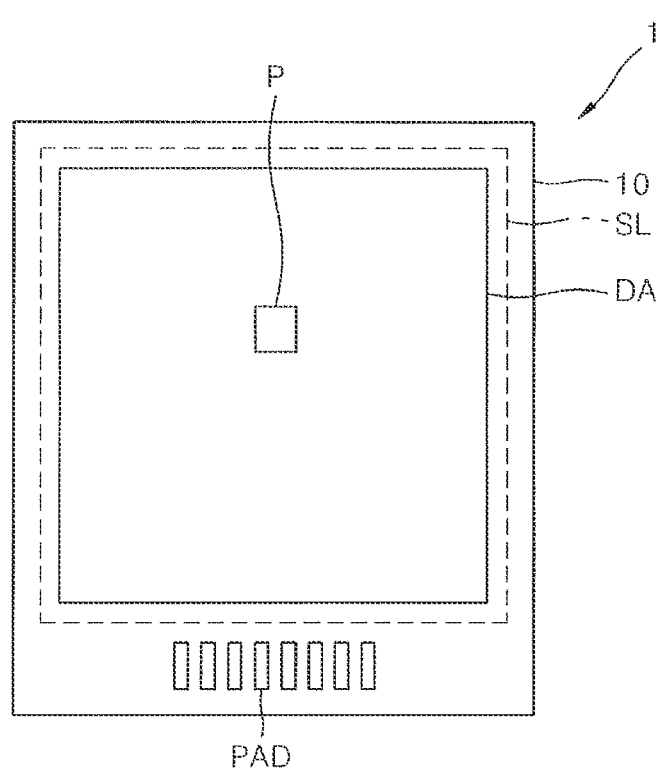
FIG. 1 illustrates a plan view schematically illustrating an organic light-emitting display apparatus 1 according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements throughout.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a plan view schematically illustrating an organic light-emitting display apparatus 1 according to an embodiment.

Referring to FIG. 1, a display area DA displaying an image includes a plurality of pixels P and may be formed on a substrate 10 of the organic light-emitting display apparatus 1 according to the embodiment. The display area DA may be formed inside an area delimited by a sealing line SL, and a sealing member (not shown) seals the display area DA along the sealing line SL. Thin film transistors and organic light-emitting devices constitute the plurality of pixels P and are arranged in the display area DA.

Figure 2:
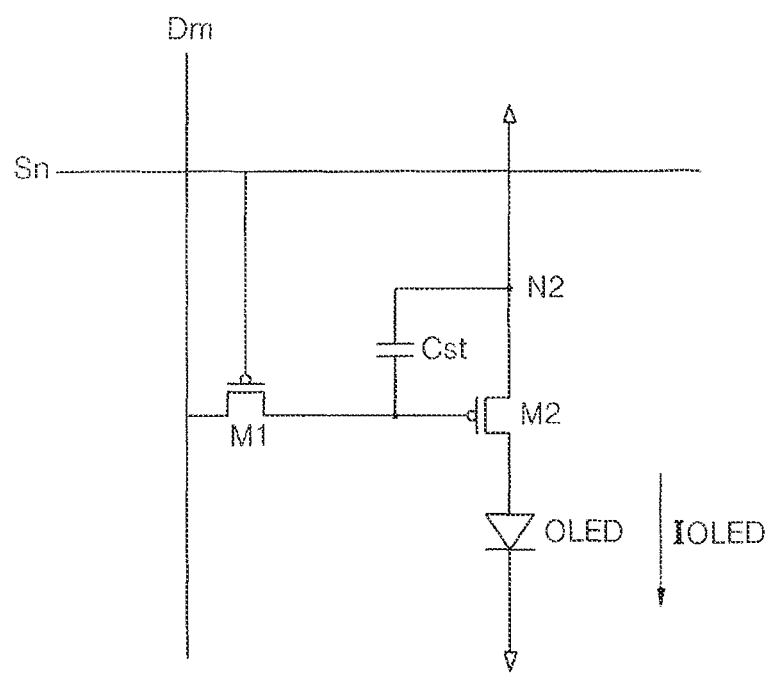
FIG. 2 illustrates an example of an equivalent circuit constituting a single pixel according to an embodiment.

FIG. 2 illustrates an example of an equivalent circuit constituting a single pixel according to an embodiment.

The plurality of pixels P may include a switching transistor M1, a driving transistor M2, a storage capacitor Cst, and a light-emitting device OLED.

According to an embodiment, when a signal of a scan line Sn is activated, a voltage level of a data line Dm is stored in the storage capacitor Cst through the switching transistor M1. The driving transistor M2 generates a light-emitting current $I_{OLED}$ according to a gate-source voltage Vgs, which is determined by the voltage level stored in the storage capacitor Cst, to power the light-emitting device OLED. According to an embodiment, the light-emitting device OLED may be an organic light-emitting diode.

In order to drive the light-emitting device OLED, the switching transistor M1 is sequentially turned on/off by a gate signal which is applied to the scan line Sn in a predetermined frame of time, and a data voltage, which is applied to the data line Dm during the switching transistor M1 is turned on, is stored in the storage capacitor Cst that is connected to the driving transistor M2. The switching transistor M1 and the driving transistor M2 may be thin film transistors.

Generally, a voltage drop may occur in the scan line Sn as the resolution and size of the organic light-emitting display apparatus 1 are increased, and switching transistors M1 included in the plurality of pixels P may not be turned on/off together in a predetermined period of time. In order to address such situations and decrease the resistance of wirings such as the scan line Sn, highly conductive wirings may be used or a thickness of the wirings may be increased. Also, in order to decrease a parasitic capacitance generated between overlapping wirings, a thickness of an insulator may be increased or a parasitic capacitance of a thin film transistor that is connected to the wirings may be decreased.

Figure 3:
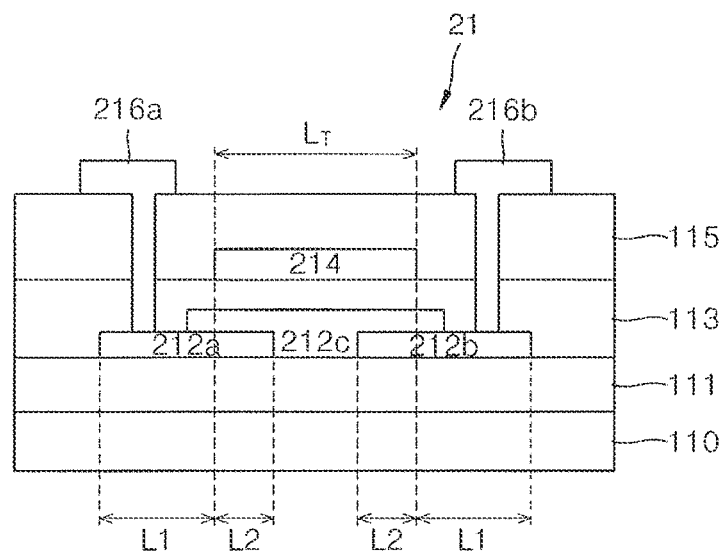
FIG. 3 illustrates an example of a thin film transistor according to an embodiment.

FIG. 3 illustrates an example of a thin film transistor according to an embodiment.

A first transistor 21 according to an embodiment may be formed on a substrate 110 and a buffer layer 111, and includes active layers 212a, 212b, and 212c, a gate insulating layer 113, a gate electrode 214, an interlayer insulating layer 115, a source electrode 216a, and a drain electrode 216b.

The substrate 110 may be a plastic substrate, such as, for example, polyethylene terephthalate (PET), polyethylene naphthalate (PEN), or polyimide, or a glass substrate.

The buffer layer 111, for example, for planarizing and blocking penetration of impurity elements in the substrate 110, may be provided. The buffer layer 111 may be formed as, e.g., a single layer or multilayers of silicon nitride and/or silicon oxide.

The active layers 212a, 212b, and 212c are disposed on the buffer layer 111. The active layer 212 includes a first silicon active layer 212a, a second silicon active layer 212b, and an oxide active layer 212c. The oxide active layer 212c may be disposed in a space between the first silicon active layer 212a and the second silicon active layer 212b.

The first silicon active layer 212a and the second silicon active layer 212b may include amorphous silicon or polysilicon. The first silicon active layer 212a and the second silicon active layer 212b may include doped regions L1 and undoped regions L2 in which silicon of the first silicon active layer 212a and the second silicon active layer 212b are respectively doped and undoped with $N^+$ or $P^+$ ion impurities. The doped region L1 is a region that does not overlap the gate electrode 214, and the conductivity thereof may be increased by being doped with the ion impurities, and the electron mobility thereof may be excellent.

The oxide active layer 212c filling the space between the first silicon active layer 212a and the second silicon active layer 212b may include an oxide semiconductor. For example, the oxide active layer 212c may include an $(In_2O_3)_a(Ga_2O_3)_b(ZnO)_c$ (G-I-Z-O) layer (where a, b, and c are real numbers respectively satisfying conditions of a≥0, b≥0, and c>0), and in addition, may include an oxide of a material selected from the group of Groups 12, 13, and 14 metallic elements, such as zinc (Zn), indium (In), gallium (Ga), tin (Sn), cadmium (Cd), germanium (Ge), or hafnium (Hf), and a combination thereof.

A channel region $L_T$ of the first transistor 21 is a region in which the oxide active layer 212c and the gate electrode 214 overlap. The channel region $L_T$ of the first transistor 21 includes undoped regions L2 of the first silicon active layer 212a and the second silicon active layer 212b.

The gate insulating layer 113 is disposed on the active layers 212a, 212b, and 212c. The gate insulating layer 113 may be formed as a single layer or multilayers of an inorganic insulating layer, and the inorganic insulating layer constituting the gate insulating layer 113 may include $SiO_2$, $SiN_x$, SiON, $Al_2O_3$, $TiO_2$, $Ta_2O_5$, $HfO_2$, $ZrO_2$, barium strontium titanate (BST), or lead zirconium titanate (PZT).

The gate electrode 214 is disposed on the gate insulating layer 113. The gate electrode 214, for example, may be formed as a single layer or multilayers of one or more metals selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The interlayer insulating layer 115 is disposed on the gate electrode 214. The interlayer insulating layer 115 may be formed as a single layer or multilayers of an inorganic insulating layer, and the inorganic insulating layer constituting the interlayer insulating layer 115 may include $SiO_2$, $SiN_x$, SiON, $Al_2O_3$, $TiO_2$, $Ta_2O_5$, $HfO_2$, $ZrO_2$, BST, or PZT.

The source electrode 216a and the drain electrode 216b are disposed on the interlayer insulating layer 115. The source electrode 216a and the drain electrode 216b are respectively connected to the first silicon active layer 212a and the second silicon active layer 212b through contact holes formed in the gate insulating layer 113 and the interlayer insulating layer 115.

The source electrode 216a and the drain electrode 216b may be formed of two or more layers of different metals having different electron mobilities. For example, the source electrode 217a and the drain electrode 217b may be formed of two or more layers of metals selected from the group of Al, Pt, Pd, Ag, Mg, Au, Ni, Nd, Ir, Cr, Li, Ca, Mo, Ti, W, Cu, and an alloy thereof.

The doped regions L1 not overlapping the gate electrode may only be doped with $N^+$ or $P^+$ ion impurities. The doped regions L1 may have high electron mobility and the undoped regions L2 may act as an insulator, and the gate electrode 214, the first silicon active layer 212a, and the second silicon active layer 212b may not form a parasitic capacitance.

Also, in the first transistor 21, the doped regions L1 of the first silicon active layer 212a and the second silicon active layer 212b may be doped with ion impurities to decrease the resistance between the oxide active layer 212c operating as the channel region $L_T$ and the source electrode 216a and the drain electrode 216b, and the current may be increased when the first transistor 21 is turned on. Since a silicon semiconductor is doped with ions and used, the device reliability as well as the conductivity may be improved in comparison to the case of doping an oxide semiconductor with ion impurities.

Furthermore, the oxide active layer 212c may be included in the channel region $L_T$ of the first transistor 21, and an off-state leakage current of the thin film transistor may be prevented in comparison to the case of including only silicon in the channel region $L_T$.

Figure 4A:
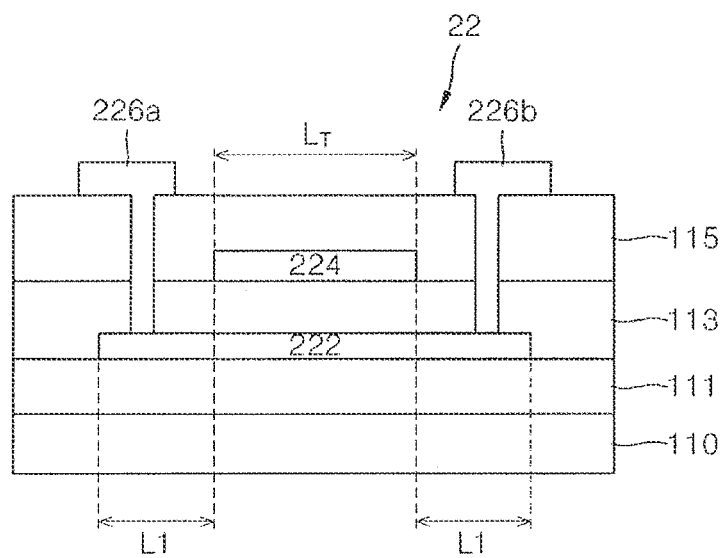
FIGS. 4A and 4B illustrate comparative examples.
Figure 4B:
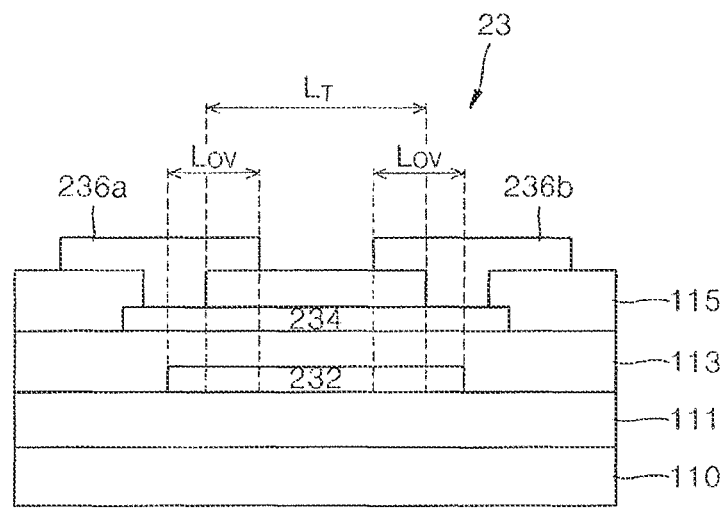

FIGS. 4A and 4B illustrate comparative examples. In the comparative examples of FIGS. 4A and 4B, the same reference numerals as in FIG. 3 may denote the same elements.

FIG. 4A illustrates a thin film transistor 22 according to a first comparative example of the first transistor 21 of FIG. 3.

The second transistor 22 of FIG. 4A, different from the first transistor 21 of FIG. 3, includes a single silicon active layer 222 as an active layer. The silicon active layer 222 may be formed of a semiconductor including amorphous silicon or polysilicon. The silicon active layer 222 may include a channel region $L_T$ at the center and doped regions L1 doped with ion impurities on the outside of the channel region $L_T$. The doped regions L1 include a source region (L1 on the left) and a drain region (L1 on the right), the doped regions L1 may be doped with $N^+$ or $P^+$ ion impurities using a gate electrode 224 as a mask, and the conductivity thereof may be increased.

The doped regions L1 of the silicon active layer 222 are respectively connected to a source electrode 226a and a drain electrode 226b through contact holes formed in the gate insulating layer 113 and the interlayer insulating layer 115.

The silicon active layer 222 of the second transistor 22 may have excellent electron mobility. However, a leakage current may occur at a high voltage, and a voltage stored in the storage capacitor Cst may be changed or decreased during the driving of the thin film transistor. The size of the storage capacitor Cst may be increased in order to prevent the changes in the voltage. However, this may result in the reduction of an aperture ratio in a limited space of an organic light-emitting display apparatus, and the lifetime of the organic light-emitting display apparatus may be decreased and the power consumption may be decreased due to an increase in the driving voltage. In order to reduce or prevent the occurrence of the leakage current, an oxide semiconductor, which has relatively low electron mobility but may have excellent leakage current suppression characteristics, may be used as an active layer of a switching transistor.

FIG. 4B illustrates a third transistor 23 according to a second comparative example of the first transistor 21 of FIG. 3.

In the thin film transistor of FIG. 4B, a gate electrode 232 may be formed on the buffer layer 111. Also, an oxide active layer 234 is disposed on the gate electrode 232 having the gate insulating layer 113 disposed therebetween.

The oxide active layer 234 may include an oxide semiconductor. For example, the oxide active layer 234 may include an $(In_2O_3)_a(Ga_2O_3)_b(ZnO)_c$ (G-I-Z-O) layer (where a, b, and c are real numbers respectively satisfying conditions of a≥0, b≥0, and c>0), and in addition, may include an oxide of a material selected from the group of Groups 12, 13, and 14 metallic elements, such as Zn, In, Ga, Sn, Cd, Ge, or Hf, and a combination thereof.

The interlayer insulating layer 115 is disposed on the oxide active layer 234, and a source electrode 236a and a drain electrode 236b are in contact with the oxide active layer 234 through contact holes formed in the interlayer insulating layer 115. In the second comparative example of FIG. 4B, the interlayer insulating layer 115 may act as an etch stop layer for protecting the oxide active layer 234 during the patterning of the source electrode 236a and the drain electrode 236b.

The third transistor 23 may include overlap regions Lov, in which the gate electrode 232 overlaps the source electrode 236a and the drain electrode 236b having the insulating layer disposed therebetween, due to the structure of the thin film transistor. The gate electrode 232, the source electrode 236a, and the drain electrode 236b of the overlap regions Lov may respectively act as a capacitor to generate a parasitic capacitance, and it may be a cause of a RC load during the driving of an organic light-emitting display apparatus. As illustrated in FIG. 4B, when the third transistor 23 is in an "on" state in a bottom gate-type thin film transistor structure, the oxide active layer 234 acts as a conductor to form the gate electrode 232-the gate insulating layer 113-the oxide active layer 234 as a capacitor, and when the third transistor 23 is in an "off" state, the gate electrode 232-the gate insulating layer 113-the oxide active layer 234-the interlayer insulating layer 115-the source and drain electrodes 236a and 236b form a capacitor to generate a parasitic capacitance.

A thin film transistor may be the third transistor 23, and a value of a resistance connected to the wiring may increase during the driving due to the parasitic capacitance when the thin film transistor is turned on and off. With respect to a large-sized and high-resolution display, on/off of a switching transistor in a short period of time may be impaired due to a signal delay caused by the resistance and parasitic capacitance. Also, when a signal voltage of a data line is stored in a storage capacitor connected to the driving transistor, time for charging a data voltage may be significantly limited due to the signal delay caused by the resistance and parasitic capacitance of the data line.

When a thickness of the gate insulating layer 113 is increased in order to decrease the parasitic capacitance, an on-state current of the thin film transistor may decrease and, the storage capacitor, which is used in the circuit of a pixel connected to the switching transistor, may not be sufficiently charged in a short period of time. Also, a thickness of signal wirings, such as the gate electrode 232, may be increased in order to decrease the signal delay. However, the thickness of the gate insulating layer 113 may be increased in order to prevent a short circuit due to a step height, and a current driving capability of the third transistor 23 may decrease and a charging time of the storage capacitor may increase.

In order to decrease the parasitic capacitance, a thickness of the metal wirings (gate electrode, source electrode, and drain electrode) may be increased to decrease the resistance thereof. However, referring to FIG. 4B, when the thickness of the gate electrode 232 is increased, the thickness of the gate insulating layer 113 may be increased in order to prevent the short circuit due to the step height. The current driving capability of the third transistor 23 may decrease, increasing the charging time of the storage capacitor, and making the driving of the large-sized and high-resolution display difficult.

With respect to a thin film transistor using the oxide active layer 234, the top-gate structure thin film transistor as in FIG. 4A may be used in order to decrease the parasitic capacitance due to the above-described overlap. An oxide active layer may be used instead of the silicon active layer 222 of FIG. 4A. The resistance of the doped regions L1 may be decreased and the conductivity thereof may be increased by doping remaining portions excluding the channel region $L_T$ using the gate electrode 224 as a mask. However, with respect to the transistor having the above structure, decreases in resistances of the source region L1 and the drain region L2 by doping may not be facilitated different from the second transistor 22 having the silicon active layer 222, and deviations in the characteristics of the thin film transistor may occur or the reliability thereof may be decreased when ion doping is performed to increase the conductivity.

The first transistor 21 according to the embodiment has characteristics in which the parasitic capacitance may decrease, the on-state current flowing in the thin film transistor may increase, and the off-state leakage current may decrease in comparison to the second transistor 22 and the third transistor 23 of the comparative examples.

Figure 5:
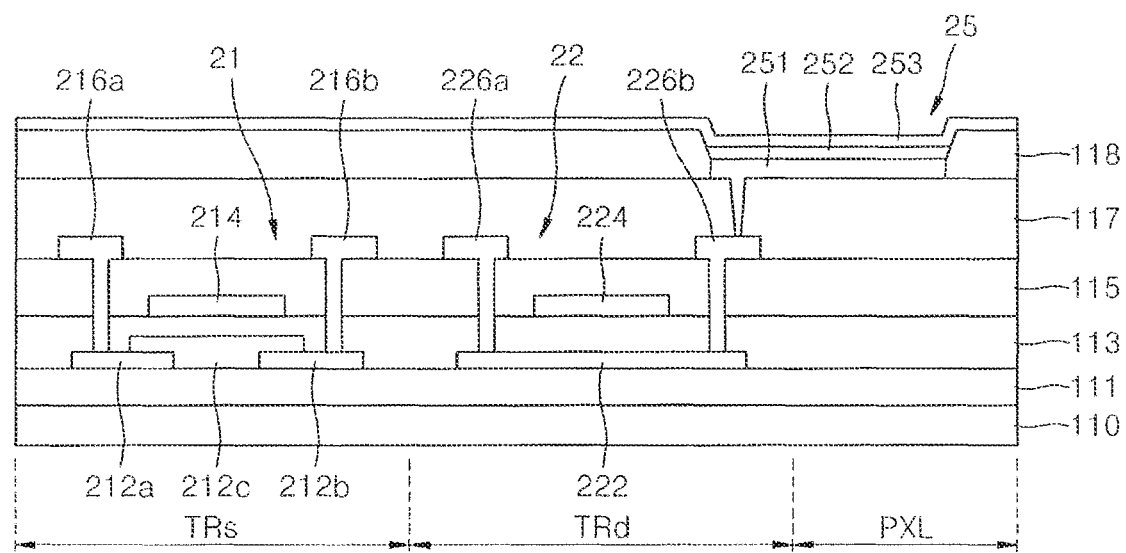
FIG. 5 illustrates a cross-sectional view schematically illustrating the organic light-emitting display apparatus 1 according to the embodiment.

FIG. 5 illustrates a cross-sectional view schematically illustrating the organic light-emitting display apparatus 1 according to the embodiment.

The organic light-emitting display apparatus 1 of FIG. 5 may include a first transistor region TRs, a second transistor region TRd, and a pixel region PXL. The first transistor region TRs may include the first transistor 21 described in FIG. 3, and the second transistor region TRd may include the second transistor 22 described in FIG. 4A. According to an embodiment, a switching transistor may be disposed in the first transistor region TRs and a driving transistor connected to a pixel electrode 251 may be disposed in the second transistor region TRd.

A light-emitting device 25 may be disposed in the pixel region PXL, and the light-emitting device 25 may include the pixel electrode 251, an intermediate layer 252, and a counter electrode 253.

The first transistor 21 is included in the first transistor region TRs. An off-state leakage current of the first transistor 21 may be lower than that of the second transistor 22. The first transistor 21 may be used as the switching transistor M1, in which the leakage current suppression characteristics are important, and the second transistor 22 having high electron mobility may be used as the driving transistor M2, in which the effect of the leakage current is small. Also, with respect to the organic light-emitting display apparatus 1 having the structure as in FIG. 5, the leakage current of the first transistor 21 acting as the switching transistor M1 may be prevented and simultaneously, the parasitic capacitance may not be generated, and the first transistor 21 may be appropriate for driving the large-sized organic light-emitting display apparatus 1.

Hereinafter, a method of manufacturing the organic light-emitting display apparatus 1 according to an embodiment will be described with reference to FIGS. 6A through 6G.

Figure 6A:
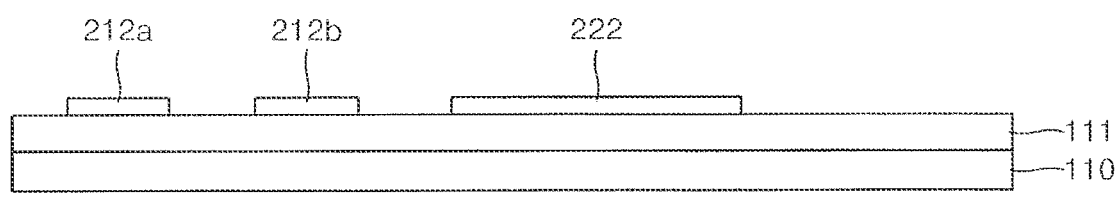
FIGS. 6A through 6H illustrate a method of manufacturing an organic light-emitting display apparatus according to an embodiment.

FIG. 6A illustrates a cross-sectional view schematically illustrating a first mask process for manufacturing the organic light-emitting display apparatus 1 according to the present embodiment.

Referring to FIG. 6A, a buffer layer 111 may be formed on a substrate 110 and a silicon semiconductor layer (not shown) may be formed on the buffer layer 11. Then, a first silicon active layer 212a and a second silicon active layer 212b of a first transistor 21 and a silicon active layer 222 of a second transistor 22 may be formed by patterning the silicon semiconductor layer (not shown).

Although not illustrated in FIG. 6A, the silicon semiconductor layer (not shown) may be coated with a photoresist (not shown) and the silicon semiconductor layer (not shown) may then be patterned by photolithography using a first photomask (not shown) to form the above-described first silicon active layer 212a, second silicon active layer 212b, and silicon active layer 222. The first mask process by photolithography may be performed through a series of processes, such as developing, etching, and stripping or ashing, after the first photomask (not shown) is exposed with an exposure apparatus (not shown).

The silicon semiconductor layer (not shown) may be formed of amorphous silicon or polysilicon. The polysilicon may be formed by crystallization of the amorphous silicon. Various methods, such as rapid thermal annealing (RTA), solid phase crystallization (SPC), excimer laser annealing (ELA), metal induced crystallization (MIC), metal induced lateral crystallization (MILC), and sequential lateral solidification (SLS), may be used as a crystallization method of the amorphous silicon.

Figure 6B:
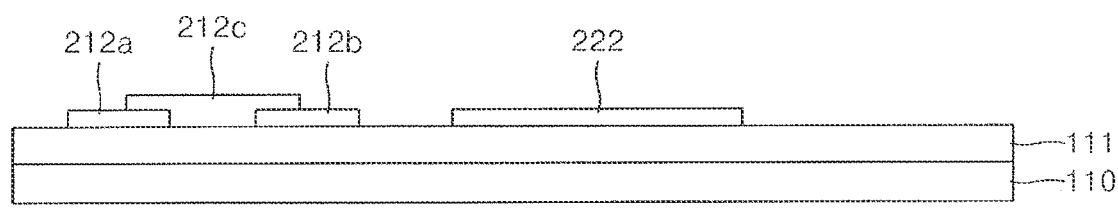

FIG. 6B illustrates a cross-sectional view schematically illustrating a second mask process for manufacturing the organic light-emitting display apparatus 1 according to the present embodiment.

An oxide semiconductor layer (not shown) may be formed on the product of the first mask process of FIG. 6A, and an oxide active layer 212c of the first transistor 21 may then be formed by patterning the oxide semiconductor layer (not shown). The oxide active layer 212c may be disposed in a space between the first silicon active layer 212a and the second silicon active layer 212b, and as illustrated in FIG. 6B, the oxide active layer 212c may be formed to partially overlap the first silicon active layer 212a and the second silicon active layer 212b.

The oxide active layer 212c may include an oxide semiconductor. For example, the oxide semiconductor layer (not shown) may include an $(In_2O_3)_a(Ga_2O_3)_b(ZnO)_c$ (G-I-Z-O) layer (where a, b, and c are real numbers respectively satisfying conditions of a≥0, b≥0, and c>0), and in addition, may include an oxide of a material selected from the group of Groups 12, 13, and 14 metallic elements, such as Zn, In, Ga, Sn, Cd, Ge, or Hf, and a combination thereof.

Figure 6C:
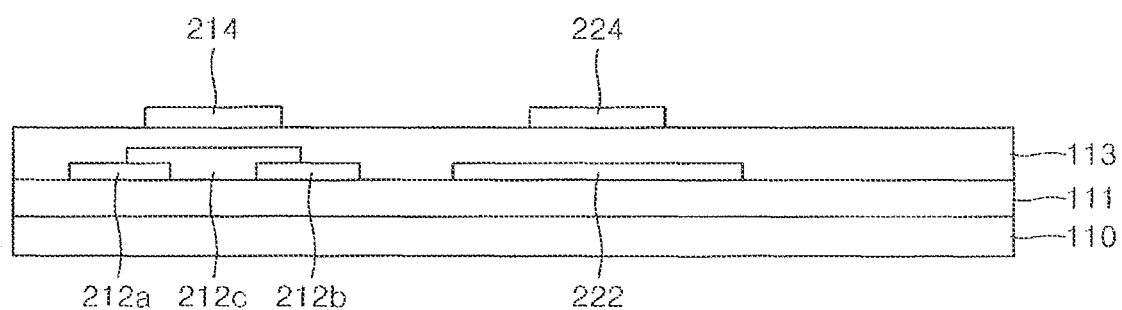

FIG. 6C illustrates a cross-sectional view schematically illustrating a third mask process for manufacturing the organic light-emitting display apparatus 1 according to the present embodiment.

A gate insulating layer 113 may be formed on the product of the second mask process of FIG. 6B, a first metal layer (not shown) is stacked on the gate insulating layer 113, and the first metal layer (not shown) may then be patterned. The first metal layer (not shown) may be formed as a single layer or multilayers of one or more metals selected from the group of Al, Pt, Pd, Ag, Mg, Au, Ni, Nd, Ir, Cr, Li, Ca, Mo, Ti, W, and Cu.

As a result of the patterning, a gate electrode 214 of the first transistor 21 and a gate electrode 224 of the second transistor 22 may be formed on the gate insulating layer 113.

The resultant structure as described above is doped with ion impurities. $N^+$ or $P^+$ ions may be doped as ion impurities, and the first silicon active layer 212a, the second silicon active layer 212b, and silicon active layer 222 may be doped at a concentration of, e.g., about $1\times10^{15}$ atoms/cm$^3$ or more.

The first silicon active layer 212a, the second silicon active layer 212b, and silicon active layer 222 may be doped with ion impurities by using the gate electrode 214 and the gate electrode 224 as self-aligned masks, and electron mobilities of doping regions L1 may increase. In the first transistor 21 and the second transistor 22, remaining regions excluding the doping regions L1 may be channel regions $L_T$.

Figure 6D:
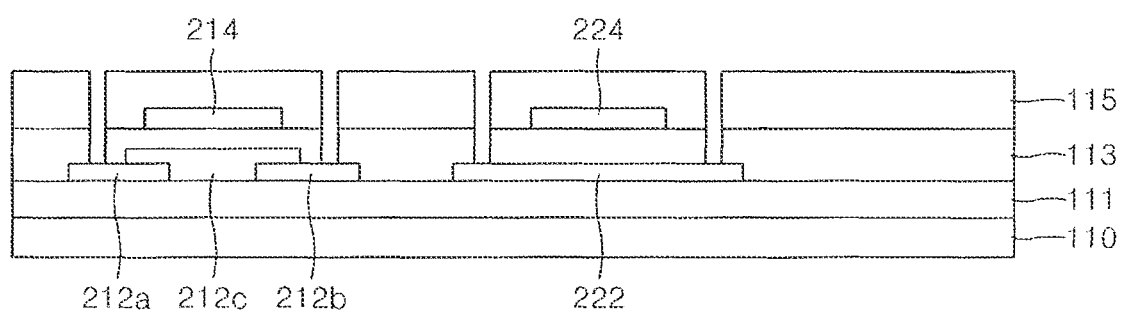

FIG. 6D illustrates a cross-sectional view schematically illustrating a fourth mask process for manufacturing the organic light-emitting display apparatus 1 according to the present embodiment.

An interlayer insulating layer 115 may be formed on the product of the third mask process of FIG. 6C, and the interlayer insulating layer 115 may be patterned to form openings exposing the first silicon active layer 212a and the second silicon active layer 212b.

Figure 6E:
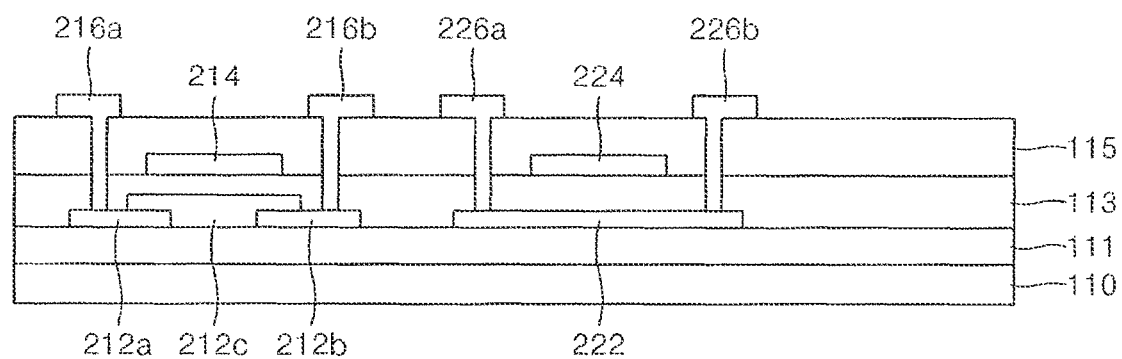

FIG. 6E illustrates a cross-sectional view schematically illustrating a result of a fifth mask process for manufacturing the organic light-emitting display apparatus 1 according to the present embodiment.

Referring to FIG. 6E, a second metal layer (not shown) may be formed on the product of the fourth mask process of FIG. 6D, and the second metal layer (not shown) may be patterned to simultaneously form a source electrode 216a and a drain electrode 216b of the first transistor 21 and a source electrode 226a and a drain electrode 226b of the second transistor 22.

The second metal layer (not shown) may be formed of two or more layers of different metals having different electron mobilities. For example, the second metal layer (not shown) may be formed of two or more layers of metals selected from the group of Al, Pt, Pd, Ag, Mg, Au, Ni, Nd, Ir, Cr, Li, Ca, Mo, Ti, W, Cu, and an alloy thereof.

Figure 6F:
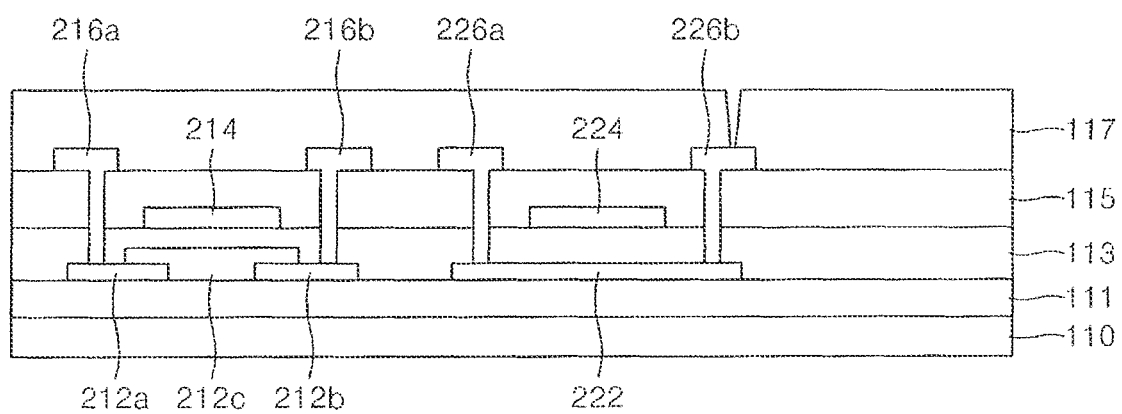

FIG. 6F illustrates a cross-sectional view schematically illustrating a result of a sixth mask process for manufacturing the organic light-emitting display apparatus 1 according to the present embodiment.

Referring to FIG. 6F, a planarization layer 117 may be formed on the product of the fifth mask process of FIG. 6E, and the planarization layer 117 may be patterned to form a contact hole exposing the source electrode 226a or the drain electrode 226b of the second transistor 22.

The planarization layer 117 may be formed of an organic insulating layer. A general-purpose polymer (e.g., polymethyl methacrylate (PMMA) or polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, and a blend thereof may be used as the organic insulating layer.

Figure 6G:
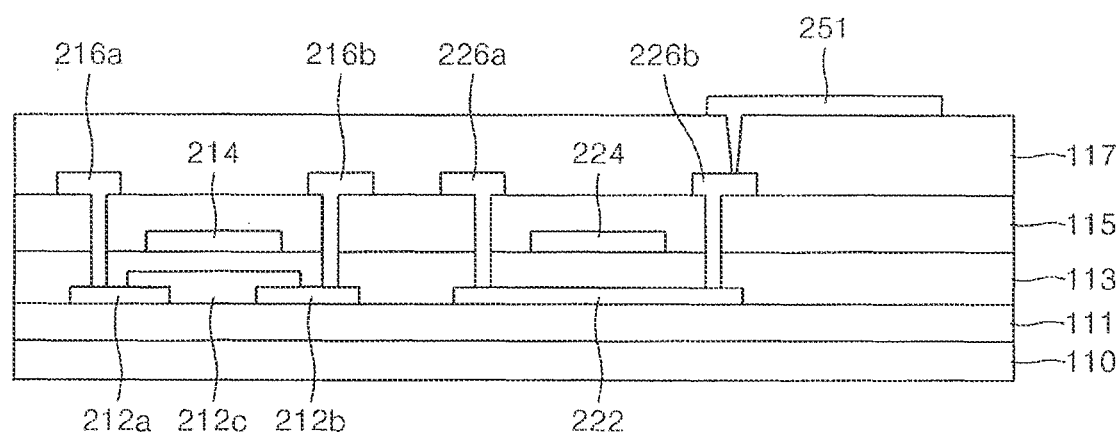

FIG. 6G illustrates a cross-sectional view schematically illustrating a result of a seventh mask process for manufacturing the organic light-emitting display apparatus 1 according to the present embodiment.

A third conductive layer (not shown) may be formed on the product of the sixth mask process of FIG. 6F, and the third conductive layer (not shown) may be patterned to form a pixel electrode 251 which is in contact with the source electrode 226a or the drain electrode 226b of the second transistor 22 through the contact hole formed in the planarization layer 117.

The display apparatus may be a bottom-emission type display apparatus, and the third conductive layer (not shown) may be included as a transparent electrode. The display apparatus may be a top-emission type display apparatus, and the third conductive layer (not shown) may be included as a reflective electrode.

The display apparatus may be a bottom-emission type display apparatus, and the third conductive layer (not shown) may include at least one or more selected from the group of indium tin oxide (ITO), indium zinc oxide (IZO), zinc oxide (ZnO), indium oxide ($In_2O_3$), indium gallium oxide (IGO), and aluminum zinc oxide (AZO). Also, the pixel electrode 251 may have a three-layer structure composed of transparent conductive oxide layer/semi-transparent metal layer/transparent conductive oxide layer.

The display apparatus may be a top-emission type display apparatus, and a reflective layer may be formed of Al, Pt, Pd, Ag, Mg, Au, Ni, Nd, Ir, Cr, Mg, or a combination thereof, and ITO, IZO, ZnO, $In_2O_3$, IGO, or AZO may then be formed on the reflective layer.

Figure 6H:
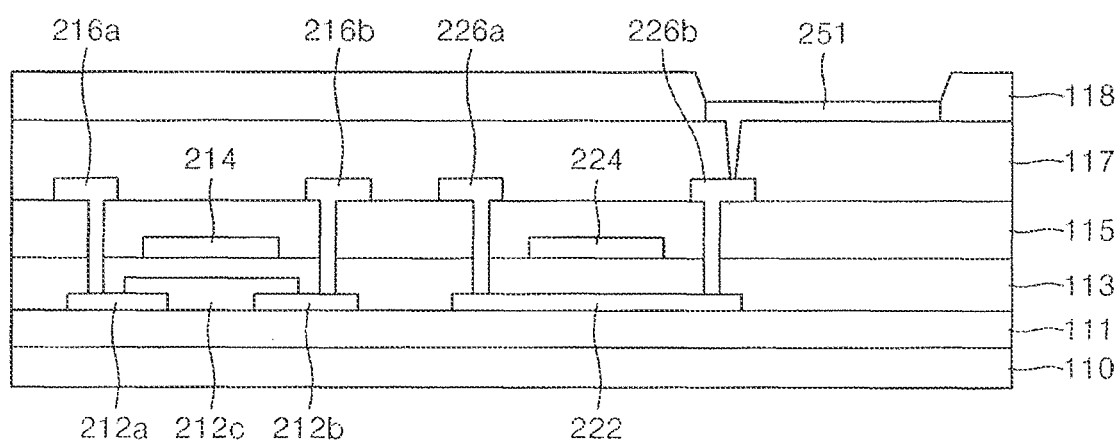

FIG. 6H illustrates a cross-sectional view schematically illustrating a result of an eighth mask process for manufacturing the organic light-emitting display apparatus 1 according to the present embodiment.

A pixel-defining layer 118 may be formed on the product of the seventh mask process of FIG. 6G, and the eighth mask process for forming an opening exposing a top of the pixel electrode 251 may be performed.

The pixel-defining layer 118, for example, may be formed of an organic insulating layer including a general-purpose polymer (e.g., PMMA or PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof.

As illustrated in FIG. 5, an intermediate layer 252 including an organic emission layer (not shown) may be formed on the product of the eighth mask process of FIG. 6H, and a counter electrode 253 may then be formed.

The intermediate layer 252 includes the organic emission layer that emits, e.g., red, green, or blue light, and a low molecular weight organic material or a polymer organic material may be used to form the organic emission layer. The organic emission layer may be a low molecular weight organic layer formed of the low molecular weight organic material, a hole transport layer (HTL) and a hole injection layer (HIL) may be disposed in a direction of the pixel electrode 251 about the organic emission layer, and an electron transport layer (ETL) and an electron injection layer (EIL) may be stacked in a direction of the counter electrode 253. Various layers, in addition to the HIL, the HTL, the ETL, and the EIL, may be stacked and formed in various implementations.

In the above-described embodiment, described is an example in which a separate organic emission layer may be formed for each pixel. Each pixel may emit red, green, or blue light, and a pixel group that emits red, green, and blue light may constitute a single unit pixel. The organic emission layer may be formed on the entire pixel. For example, the plurality of organic emission layers that emit red, green, and blue light may be vertically stacked or mixed to emit white light. A color conversion layer for converting the emitted white light into predetermined color or a color filter may be further included.

The counter electrode 253 opposite to the pixel electrode 251 is disposed on the intermediate layer 252. The counter electrode 253 may also be formed of a transparent electrode or a reflective electrode. A transparent electrode may be used as the counter electrode 253, the counter electrode 253 may be formed in such a manner that a metal with a low work function, e.g., Li, Ca, LiF/Ca, LiF/Al, Al, Mg, or a combination thereof, may be deposited to face the organic emission layer, and an auxiliary electrode or a bus electrode line formed of a transparent conductive oxide, such as ITO, IZO, ZnO, or $In_2O_3$, may then be formed thereon. A reflective electrode may be used as the counter electrode 253, and the counter electrode 253 may be formed by depositing Li, Ca, LiF/Ca, LiF/Al, Al, Mg, or a combination thereof on an entire surface of a display portion. An organic material, such as a conductive polymer, may be used as the pixel electrode 251 and the counter electrode 253.

As described above, according to the one or more of the above embodiments, a thin film transistor array substrate, a display apparatus, and a method of manufacturing the thin film transistor array substrate may provide the following effects.

First, a parasitic capacitance of a thin film transistor may be decreased.

Second, an off-state leakage current of a thin film transistor may be decreased and an on-state current thereof may be increased.

Third, one or more embodiments provide a light-emitting display apparatus that may have excellent device characteristics and display quality.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a substrate including a polyimide;
    a buffer layer disposed on the substrate and including at least one of silicon oxide and silicon nitride;
    a gate insulating layer disposed on the buffer layer;
    an interlayer insulating layer disposed on the gate insulating layer and including at least one of silicon oxide and silicon nitride;
    a first transistor which includes a first gate electrode, a first source electrode, a first drain electrode, and a first active layer including an oxide layer, wherein the first gate electrode is on the substrate with the oxide layer therebetween;
    a second transistor which includes a second gate electrode, a silicon layer, a second source electrode, and a second drain electrode, wherein the second gate electrode is on the substrate with the silicon layer therebetween; and a light emitting element connected to the second transistor,
wherein the buffer layer and the interlayer insulating layer include the same material in an area overlapping with the first transistor and the second transistor.

2. The organic light-emitting display apparatus as claimed in claim 1, further comprising a planarization layer disposed on the interlayer insulating layer and including an organic material.

3. The organic light-emitting display apparatus as claimed in claim 2, wherein the light emitting element comprises:
a first electrode connected to the second transistor;
a second electrode disposed on the first electrode; and
a light emitting layer disposed between the first electrode and the second electrode.

4. The organic light-emitting display apparatus as claimed in claim 3, wherein the first electrode is connected to the second drain electrode of the second transistor through a contact hole penetrating the planarization layer.

5. The organic light-emitting display apparatus as claimed in claim 4, wherein the first source electrode and the first drain electrode of the first transistor are disposed on the same layer as the second source electrode and the second drain electrode of the second transistor.

6. The organic light-emitting display apparatus as claimed in claim 5, wherein regions among the first active layer that do not overlap the first gate electrode are doped with $N^+$ or $P^+$ ion impurities.

7. The organic light-emitting display apparatus as claimed in claim 5, wherein an electron mobility of the first source electrode of the first transistor is different from an electron mobility of the first drain electrode of the first transistor.

8. The organic light-emitting display apparatus as claimed in claim 3, further comprising a pixel defining layer disposed on the planarization layer and having an opening defined to expose at least a portion of the first electrode.

9. The organic light-emitting display apparatus as claimed in claim 1, wherein the gate insulation layer comprises an inorganic material.

10. The organic light-emitting display apparatus as claimed in claim 1, wherein no parasitic capacitance is formed between portions of the first active layer and the first gate electrode of the first transistor.

11. An organic light-emitting display apparatus, comprising:
a substrate including a polyimide;
a buffer layer disposed on the substrate;
a gate insulating layer disposed on the buffer layer;
an interlayer insulating layer disposed on the gate insulating layer;
a first transistor which includes a first gate electrode, a first source electrode, a first drain electrode, and a first active layer including an oxide layer;
a second transistor which includes a second gate electrode, a silicon layer, a second source electrode, and a second drain electrode; and
a light emitting element that receives a light-emitting current from the second transistor, wherein
in a region where the first transistor is disposed and a region where the second transistor is disposed, the buffer layer and the interlayer insulating layer include at least one of silicon oxide and silicon nitride.

12. An organic light-emitting display apparatus, comprising:
a substrate including a polyimide;
a buffer layer disposed on the substrate;
a gate insulating layer disposed on the buffer layer;
an interlayer insulating layer disposed on the gate insulating layer;
a first transistor which includes a first gate electrode, a first source electrode, a first drain electrode, and a first active layer including an oxide layer;
a second transistor which includes a second gate electrode, a silicon layer, a second source electrode, and a second drain electrode; and
a light emitting element connected to the second transistor, wherein
in a region where the first transistor is disposed and a region where the second transistor is disposed, the buffer layer and the interlayer insulating layer include at least one of silicon oxide and silicon nitride,
the first gate electrode is on the substrate with the oxide layer therebetween, and
the second gate electrode is on the substrate with the silicon layer therebetween.

13. The organic light-emitting display apparatus as claimed in claim 11, further comprising a planarization layer disposed on the interlayer insulating layer and including an organic material.

14. The organic light-emitting display apparatus as claimed in claim 13, wherein the light emitting element comprises:
a first electrode connected to the second transistor;
a second electrode disposed on the first electrode; and
a light emitting layer disposed between the first electrode and the second electrode.

15. The organic light-emitting display apparatus as claimed in claim 14, wherein the first electrode is electrically connected to the second drain electrode of the second transistor through a contact hole penetrating the planarization layer.

16. The organic light-emitting display apparatus as claimed in claim 11, wherein the first gate electrode is on the substrate with the oxide layer therebetween.

17. The organic light-emitting display apparatus as claimed in claim 12, wherein the silicon layer includes amorphous silicon or polysilicon.

* * * * *